(12) United States Patent
Rotker et al.

(10) Patent No.: US 12,425,030 B2
(45) Date of Patent: Sep. 23, 2025

(54) SYSTEMS AND METHODS FOR CONFIGURABLE INTERFACE CIRCUITS

(71) Applicant: Intel Corporation, Santa Clara, CA (US)

(72) Inventors: Paul Rotker, Stow, MA (US); Lai Guan Tang, Bayan Lepas (MY); Luis Hau, Fremont, CA (US); Ilya Ganusov, San Jose, CA (US)

(73) Assignee: Altera Corporation, San Jose, CA (US)

( * ) Notice: Subject to any disclaimer, the term of this patent is extended or adjusted under 35 U.S.C. 154(b) by 767 days.

(21) Appl. No.: 17/555,253

(22) Filed: Dec. 17, 2021

(65) Prior Publication Data

US 2022/0109446 A1    Apr. 7, 2022

(51) Int. Cl.
*H03K 19/0175* (2006.01)

(52) U.S. Cl.
CPC ............................. *H03K 19/017581* (2013.01)

(58) Field of Classification Search
CPC .............................................. H03K 19/017581
See application file for complete search history.

(56) References Cited

U.S. PATENT DOCUMENTS

| | | | | |
|---|---|---|---|---|
| 9,106,229 | B1 * | 8/2015 | Hutton | H01L 25/105 |
| 10,055,526 | B1 * | 8/2018 | Lewis | H03K 19/017581 |
| 10,833,679 | B2 * | 11/2020 | Clark | H01L 25/0657 |
| 11,036,660 | B2 * | 6/2021 | Ooi | G06F 30/34 |
| 2004/0130469 | A1 * | 7/2004 | Casper | H03K 5/08 |
| | | | | 341/118 |
| 2009/0046533 | A1 * | 2/2009 | Jo | G06F 13/1694 |
| | | | | 365/230.03 |
| 2012/0250445 | A1 * | 10/2012 | Hoshino | G11C 7/10 |
| | | | | 365/230.01 |
| 2019/0041923 | A1 * | 2/2019 | Atsatt | H03K 19/00369 |
| 2019/0042533 | A1 * | 2/2019 | Custodio | G06F 15/7867 |
| 2019/0140648 | A1 * | 5/2019 | Clark | G11C 7/1078 |

(Continued)

FOREIGN PATENT DOCUMENTS

| | | | | |
|---|---|---|---|---|
| EP | 4195617 A1 * | 6/2023 | | H04L 45/66 |
| WO | 2014042738 | 3/2014 | | |

OTHER PUBLICATIONS

Korean Intellectual Property Office, Written Opinion of the International Searching Authority, International application No. PCT/US2022/049830, Mar. 15, 2023, pp. 1-6.

(Continued)

*Primary Examiner* — Seokjin Kim

(74) *Attorney, Agent, or Firm* — InventIQ Legal LLP; Steven J. Cahill

(57) ABSTRACT

An integrated circuit includes a region of logic circuits, first and second selector circuits, a first interface circuit for exchanging information with a first type of device according to a first communication protocol, and a second interface circuit for exchanging information with a second type of device according to a second communication protocol. The first selector circuit is configurable to provide signals between the region of the logic circuits and a selected one of the first or second interface circuits. The second selector circuit is configurable to provide signals between the selected one of the first or second interface circuits and the first or second type of device.

20 Claims, 5 Drawing Sheets

(56) References Cited

U.S. PATENT DOCUMENTS

2019/0227963 A1* 7/2019 Ooi ........................ H01L 25/18

OTHER PUBLICATIONS

"Direct Interface Bus (DIB) Intel® Stratix® 10 FPGA IP User Guide," Intel Corporation, Mar. 18, 2021, pp. 1-50.
David Kehlet, "Accelerating Innovation Through A Standard Chiplet Interface: The Advanced Interface Bus (AIB)," Intel Corporation, white paper, pp. 1-9.

* cited by examiner

SYSTEMS AND METHODS FOR CONFIGURABLE INTERFACE CIRCUITS

FIELD OF THE DISCLOSURE

The present disclosure relates to electronic circuit systems, and more particularly, to systems and method for configurable interface circuits in integrated circuits.

BACKGROUND

Many modern electronic systems include integrated circuit (IC) packages. An integrated circuit (IC) package may contain multiple integrated circuit dies. The integrated circuit dies in an IC package may, for example, be coupled together through an interposer, an interconnection bridge, conductive bumps, and/or a package substrate.

Programmable logic integrated circuits are a type of integrated circuit that can be programmed by a user to implement desired custom logic functions. In a typical scenario, a logic designer uses computer-aided design tools to design a custom logic circuit. When the design process is complete, the computer-aided design tools generate configuration data. The configuration data is loaded into memory elements on a programmable logic integrated circuit to configure the programmable logic integrated circuit to perform the functions of the custom logic circuit.

DETAILED DESCRIPTION

Figure 1:
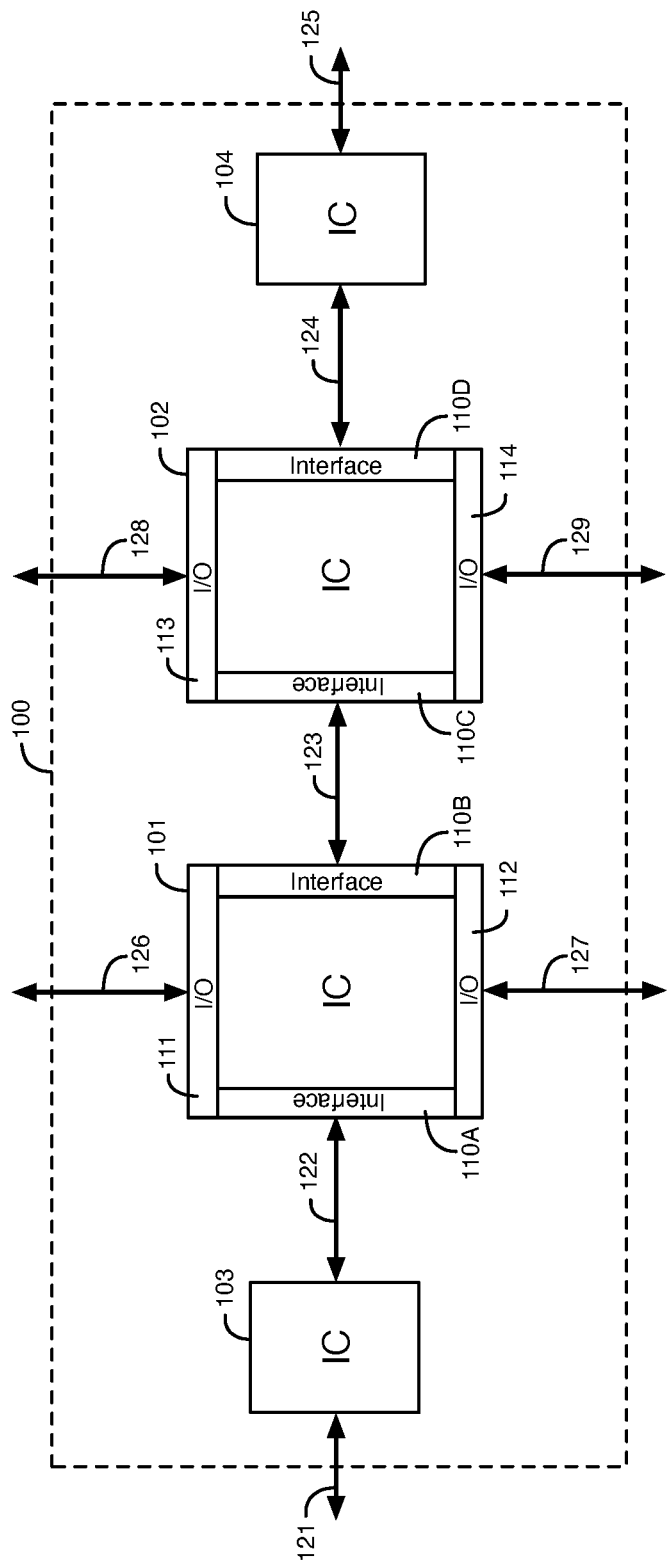
FIG. 1 is a diagram of an example of an integrated circuit (IC) package that houses four integrated circuit (IC) dies.

An integrated circuit (IC) in an IC package may exchange information with external devices that are inside and outside the IC package using one or more high speed data transmission protocols. An IC package may also be referred to herein simply as a package. In some electronic systems, the physical layer of a high speed data transmission protocol is implemented using circuitry in two or more integrated circuits that are housed in the same package. As an example, the physical layer of a data transmission protocol may be implemented in part by circuitry in a programmable logic integrated circuit (IC), such as a field programmable gate array (FPGA), and in part by circuitry in a transceiver IC that is in the same package as the programmable logic IC. The programmable logic IC may include an interface that is designed to communicate with the transceiver IC and to implement the high speed data transmission protocol.

Some electronic systems include multiple integrated circuits that perform processing functions in the same package. As an example, two, three, four, or more programmable logic ICs may be housed in the same package. Each of the programmable logic ICs in the package has an interface that implements a data transmission protocol designed to communicate with the one or more other programmable logic ICs in the same package. The integrated circuits in the package may, for example, be coupled through a package substrate or interposer in the package. As another example, two integrated circuits may be stacked vertically and coupled together in a 3-dimensional (3D) arrangement.

The interface in a programmable logic IC that is used to communicate with other programmable logic ICs in the same package is typically different than the interface in the programmable logic IC that is used to communicate with a transceiver IC die in the same package. The number of one or both of these two types of interfaces in a programmable logic IC may need to be changed if the programmable logic IC is used in a package containing a different number of programmable logic ICs and/or a different number of transceiver ICs in order to provide efficient communication between the ICs. However, the number of these two types of interfaces in a programmable logic IC is typically fixed and cannot be changed after the IC has been manufactured. Because these interfaces are fixed, a traditional programmable logic IC has to be resigned in order to provide a different number of each type of interface in the IC to provide communications in a package having a different number of each type of IC.

According to some examples disclosed herein, an integrated circuit (IC) in a package includes a configurable interface circuit that can be configured to implement a first communication protocol between a first type of IC in the package or a second communication protocol between a second type of IC in the package. The configurable interface circuit may include first interface circuitry that implements the first communication protocol and second interface circuitry that implements the second communication protocol. The first communication protocol may be used to communicate with the first type of IC in the package, and the second communication protocol may be used to communicate with the second type of IC in the package. The configurable interface circuit may also include a first selector circuit that is configurable to couple the first interface circuitry to an IC of the first type in the package. The first selector circuit may also be configurable to couple the second interface circuitry to an IC of the second type in the package. The configurable interface circuit may include a second selector circuit that is configurable to couple the first interface circuitry or the second interface circuitry to other circuits in the IC containing the configurable interface circuit. The configurable interface circuit can be reconfigured to implement a different one of the first or second communication protocols so that the configurable interface circuit can communicate with a different type of IC. The configurable interface circuit allows the IC to be used in different package configurations having different numbers of the first and second types of ICs without having to redesign the interfaces in the IC, as disclosed herein with respect to the examples provided below.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices that allows the transfer of information between circuits. The term "circuit" may mean one or more passive and/or active electrical components that are arranged to cooperate with one another to provide a desired function.

FIG. 1 is a diagram of an example of an integrated circuit (IC) package 100 that houses four integrated circuit (IC) dies. IC package 100 includes IC dies 101-104 and 9 bidirectional communication paths 121-129. Each of the communication paths 121-129 may include conductors and conductive connections in package 100. IC dies 101-102 are a first type of integrated circuit, and IC dies 103-104 are a second type of integrated circuit. The first type of integrated circuit (IC) may include, for example, processing integrated circuits. As specific examples, each of IC dies 101-102 may be a processing IC, such as a microprocessor, a graphics processing unit (GPU), or a programmable logic IC. Programmable logic ICs include any integrated circuits that can be programmed to perform desired functions, including programmable logic arrays (PLAs), programmable array logic (PAL), field programmable gate arrays (FPGAs), and programmable logic devices (PLDs).

IC die 103 communicates with one or more devices outside of package 100 through path 121. IC die 104 communicates with one or more devices outside of package 100 through path 125. The second type of IC dies 103-104 may be, for example, peripheral IC dies with respect to IC dies 101-102. One or both of the IC dies 103-104 may be, for example, a transceiver IC die. The transceiver IC dies may, for example, contain circuitry that implements the functions of a layer, such as the physical layer, of a communication protocol (e.g., a data transmission protocol). As another example, one or both of the IC dies 103-104 may be a memory IC die that stores data for the processing IC dies 101-102. The memory IC dies may, for example, contain any type of memory circuits, such as dynamic random access memory (DRAM), static random access memory (SRAM), or non-volatile memory.

IC die 101 includes interface circuit 110A, interface circuit 110B, input/output (I/O) circuit 111, and input/output (I/O) circuit 112 that are adjacent to 4 sides of IC die 101 as shown in FIG. 1. IC die 102 includes interface circuit 110C, interface circuit 110D, input/output (I/O) circuit 113, and input/output (I/O) circuit 114 that are adjacent to 4 sides of IC die 102 as shown in FIG. 1. Interface circuit 110A exchanges information with IC 103 through path 122. Interface circuits 110B and 110C exchange information with each other through path 123. Interface circuit 110D exchanges information with IC 104 through path 124. Exchanging information may, for example, include transmitting and/or receiving various types of signals (e.g., data signals, control signals, clock signals etc.) to and from another device. An example of each of the interface circuits 110A-110D is disclosed herein with respect to FIG. 2.

Each of the I/O circuits 111-114 includes input/output (I/O) buffer circuits that are used to exchange information with one or more external devices that are outside package 100. The I/O buffer circuits in I/O circuits 111 and 112 exchange signals through paths 126 and 127, respectively, with one or more external devices. The I/O buffer circuits in I/O circuits 113 and 114 exchange signals through paths 128 and 129, respectively, with one or more external devices.

Figure 2:
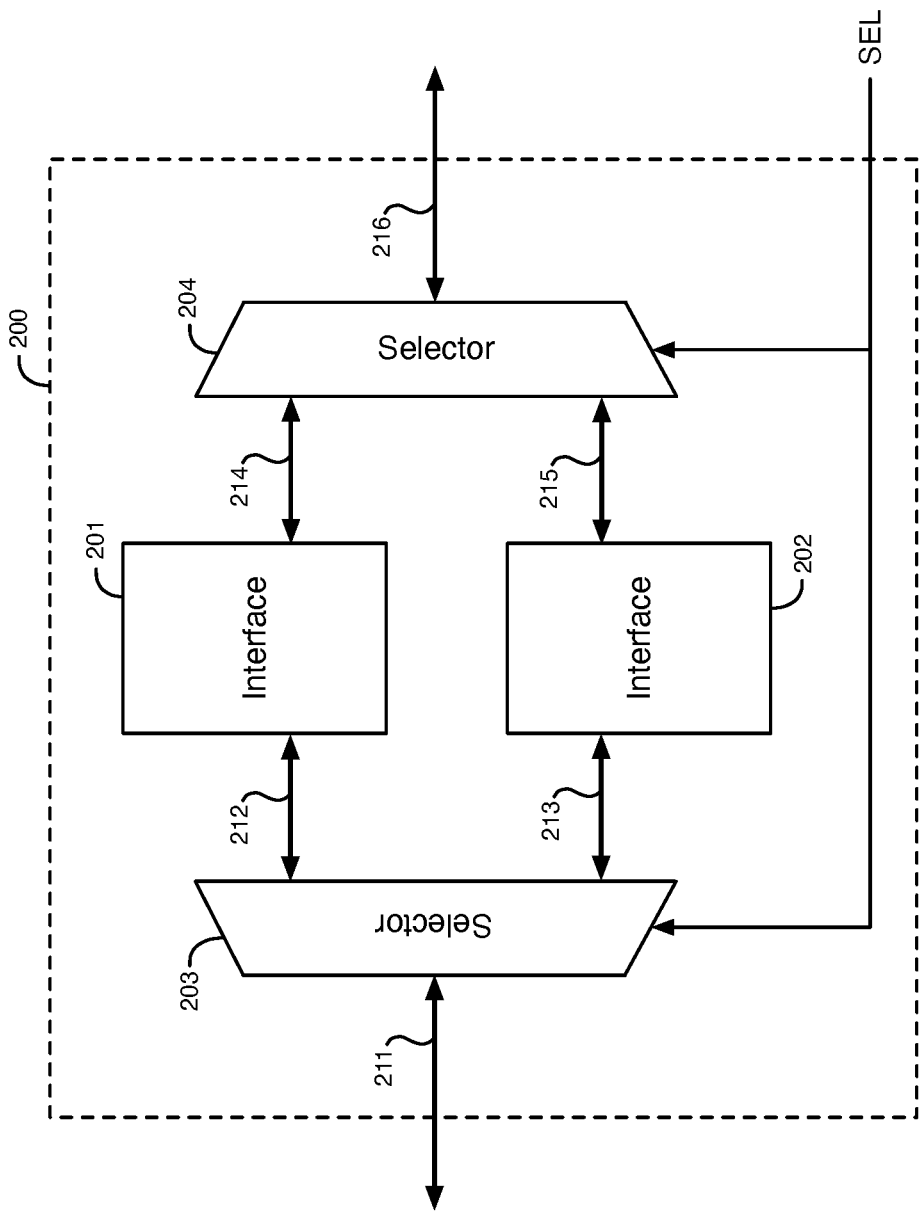
FIG. 2 is a diagram that illustrates an example of a configurable interface circuit that includes two interface circuits and two selector circuits.

FIG. 2 is a diagram that illustrates an example of a configurable interface circuit 200 that includes two interface circuits 201-202 and two selector circuits 203-204. Configurable interface circuit 200 also includes 6 conductive paths 211-216 that couple selector circuits 203-204 to interface circuits 201-202 and to other circuits and devices. Each of the paths 211-216 may include, for example, one or more conductors or buses. Configurable interface circuit 200 is an example of each of the interface circuits 110A-110D of FIG. 1. As a specific example, each of the interface circuits 110A-110D of FIG. 1 may include a different instance of configurable interface circuit 200 of FIG. 2.

Interface circuit 201 includes circuitry that implements a first communication protocol (e.g., a first data transmission protocol). As an example, interface circuit 201 may include circuitry that implements a serial or parallel die-to-die interface between a processing IC die in a package, such as a programmable logic IC or microprocessor IC, and a peripheral IC die in the package, such as a transceiver IC die or a memory IC die. Interface circuit 201 may, for example, include circuitry that implements a physical-layer (PHY) specification in the lowest level of the Open System Interconnection (OSI) Reference Model. According to this example, interface circuit 201 may transfer data between a corresponding interface in a separate IC and logic circuitry in the IC that contains interface circuit 201. Interface circuit 201 may include channel circuits. Each of these channel circuits may include I/O circuits. Each of these I/O circuits may include a transmitter circuit and/or a receiver circuit. Each transmitter circuit may be configured to transmit signals to another IC, and each receiver circuit may be configured to receive signals from another IC.

Interface circuit 201 may include, for example, two interfaces. The first interface is coupled to a corresponding interface in a nearby IC in the package, and the second interface is coupled to the logic circuitry inside the IC containing interface circuit 201. The first interface may, for example, include I/O circuits and circuits that transmit and receive clock signals and control signals used, e.g., during initialization and calibration. The second interface may, for example, also include I/O circuits and circuits that transmit and receive clock signals and control signals. Although, the details and specific electrical format of the signals in the second interface may be different than in the first interface. For example, a clock signal may be received from the second interface as a single-ended internal signal, while the corresponding clock signal may be sent across the first interface to the adjacent IC as two single data rate signals. As a more specific example that is not intended to be limiting, interface circuit 201 may include circuitry that implements the Advanced Interface Bus (AIB) standard by Intel® Corporation.

Interface circuit 202 includes circuitry that implements a second communication protocol (e.g., a second data transmission protocol) that is different than the first communication protocol implemented by interface circuit 201. As an example, interface circuit 202 may include circuitry that implements a die-to-die interface between two processing IC dies in the same package, such as two programmable logic ICs, two GPUs ICs, or two microprocessor ICs. Interface circuit 202 may include channel circuits. Each of these channel circuits may include I/O circuits. Each of these I/O circuits may include a transmitter circuit and/or a receiver circuit. Each transmitter circuit may be configured to transmit signals to another IC, and each receiver circuit may be configured to receive signals from another IC. The signals may include data signals, control signals, and/or clock signals.

According to a specific example that is not intended to be limiting, each of the channel circuits in interface circuit 202 may provide two or more modes of operation, such as a bypass mode, a synchronous mode, and an asynchronous mode. In bypass mode, interface circuit 202 functions as one or more serial or parallel wired connections between two IC dies. In synchronous mode, interface circuit 202 transmits signals between the two IC dies using circuits that implement time division multiplexing using a local clock signal that is synchronous with a system clock signal. As an example, the local clock signal and the system clock signal in a receiver circuit in interface circuit 202 may be derived from a source synchronous clock signal received from a transmitter circuit in an interface circuit 202 in another IC die. In asynchronous mode, the interface circuit 202 transmits signals between the two IC dies using circuits that implement time division multiplexing using a local clock signal that is asynchronous with the system clock signal. The transmitter and receiver clock signals in the same interface circuit 202 may not be synchronous. As a more specific example that is not intended to be limiting, interface circuit 202 may include circuitry that implements the Direct Interface Bus (DIB) standard by Intel® Corporation.

Selector circuits 203-204 are bidirectional selectors that are configurable to exchange signals between interface circuit 201 or 202 and other circuits. One or more first data inputs and outputs of selector circuit 203 are coupled to interface circuit 201 through path 212. One or more second data inputs and outputs of selector circuit 203 are coupled to interface circuit 202 through path 213. One or more third data inputs and outputs of selector circuit 203 are coupled to exchange signals with one or more circuits outside configurable interface circuit 200 through path 211. A select input of selector circuit 203 is coupled to receive a select signal SEL. Select signal SEL may be set to a first value during manufacture or assembly of the package to configure selector circuit 203 to couple path 211 to interface circuit 201 through its first data inputs/outputs and path 212. With this first configuration, selector circuit 203 can exchange signals indicating information, such as control signals, data signals, and clock signals, between path 211 and interface circuit 201 via its first data inputs/outputs and path 212.

Alternatively, select signal SEL may be set to a second value during manufacture or assembly to configure selector circuit 203 to couple path 211 to interface circuit 202 through its second data inputs/outputs and path 213. With this second configuration, selector circuit 203 can exchange signals indicating information, such as control signals, data signals, and clock signals, between path 211 and interface circuit 202 via its second data inputs/outputs and path 213. In both the first and the second configurations, selector circuit 203 functions as a multiplexer circuit for signals transmitted from interface circuit 201 or 202 to path 211 and as a demultiplexer circuit for signals received through path 211 and provided to interface circuit 201 or 202.

One or more first data inputs and outputs of selector circuit 204 are coupled to interface circuit 201 through path 214. One or more second data inputs and outputs of selector circuit 204 are coupled to interface circuit 202 through path 215. One or more third data inputs and outputs of selector circuit 204 are coupled to exchange signals with one or more circuits outside configurable interface circuit 200 through path 216. In response to the select signal SEL having the first value, selector circuit 204 couples path 216 to interface circuit 201 through its first data inputs/outputs and path 214. With this first configuration, selector circuit 204 can exchange signals indicating information, such as control signals, data signals, and clock signals, between path 216 and interface circuit 201 via its first data inputs/outputs and path 214.

Alternatively, in response to the select signal SEL having the second value, selector circuit 204 couples path 216 to interface circuit 202 through its second data inputs/outputs and path 215. With this second configuration, selector circuit 204 can exchange signals indicating information, such as control signals, data signals, and clock signals, between path 216 and interface circuit 202 via its second data inputs/outputs and path 215. In both the first and the second configurations, selector circuit 204 functions as a multiplexer circuit for signals transmitted from interface circuit 201 or 202 to path 216 and as a demultiplexer circuit for signals received through path 216 and provided to interface circuit 201 or 202.

When the select signal SEL has the first value, selector circuits 203-204 exchange signals between circuits in the IC die containing configurable interface circuit 200 and another IC die in the package through interface circuit 201 using the first communication protocol. In this configuration, interface circuit 202 is unused. When the select signal SEL has the second value, selector circuits 203-204 exchange signals between circuits in the IC die containing configurable interface circuit 200 and another IC die in the package through interface circuit 202 using the second communication protocol. In this configuration, interface circuit 201 is unused. In either of these configurations, either of the selector circuits 203 or 204 may be coupled to logic circuits in the IC die containing configurable interface circuit 200, and the other one of the selector circuits 203 or 204 may be coupled to the other IC die.

In an implementation of FIG. 1, each of the interface circuits 110B and 110C is configured during the manufacture of package 100 to provide signals through interface circuit 202 using selector circuits 203 and 204 by setting SEL to the second value, because each of the interface circuits 110B and 110C is coupled to exchange signals with another interface circuit in one of the first type of ICs 101-102. According to this implementation of FIG. 1, each of the interface circuits 110A and 110D is configured during the manufacture of package 100 to provide signals through interface circuit 201 using selector circuits 203 and 204 by setting SEL to the first value, because interface circuits 110A and 110D are coupled to the second type of ICs 103-104, respectively.

Figure 3:
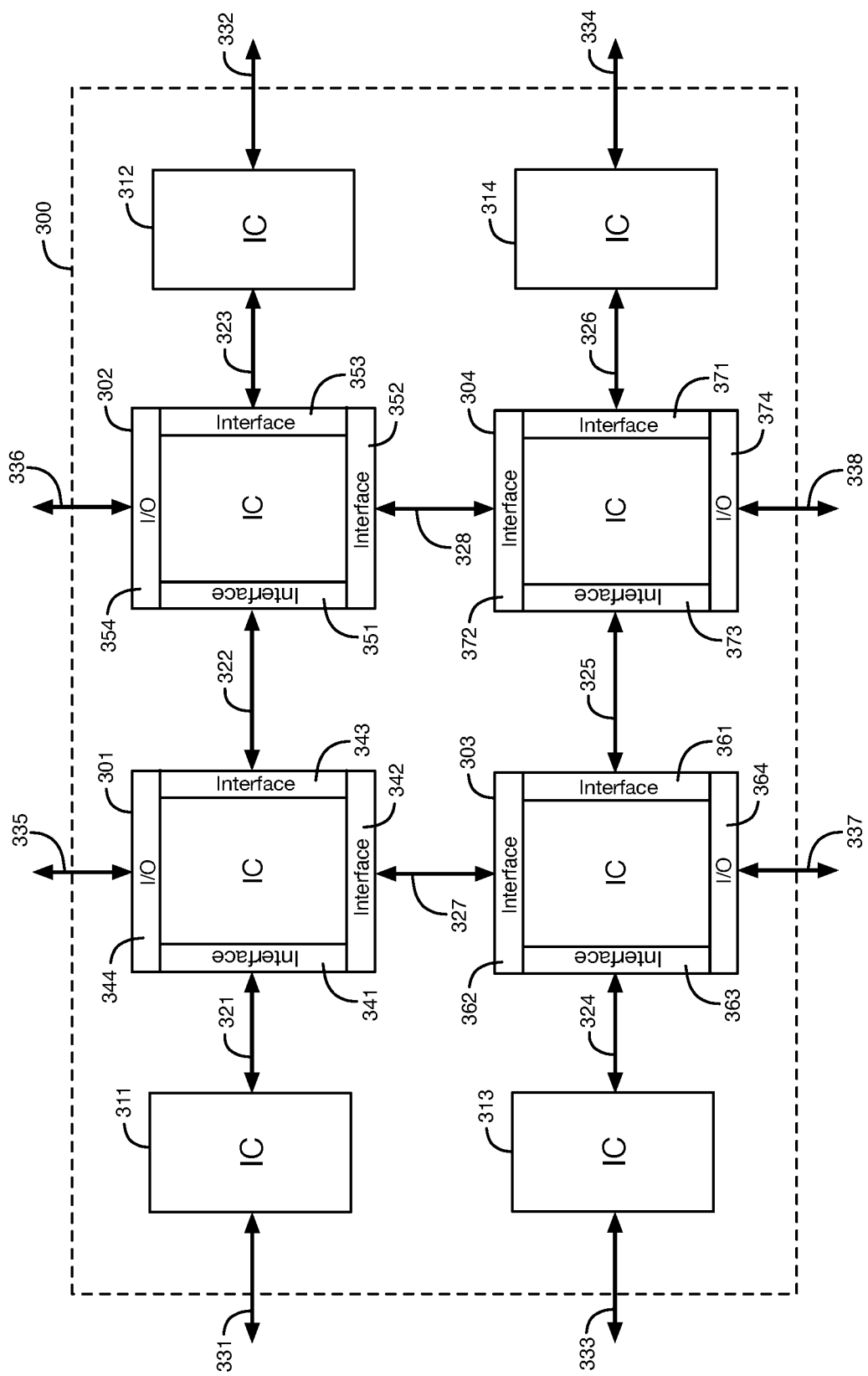
FIG. 3 is a diagram of an example of an integrated circuit (IC) package that houses 8 integrated circuit (IC) dies.

FIG. 3 is a diagram of an example of an integrated circuit (IC) package 300 that houses 8 integrated circuit (IC) dies. IC package 300 houses IC dies 301-304 and 311-314. IC package 300 also includes 16 bidirectional communication paths 321-328 and 331-338. Each of the communication paths 321-328 and 331-338 may include conductive connections and conductors in package 300. IC dies 301-304 are a first type of integrated circuit, and IC dies 311-314 are a second type of integrated circuit. As an example, the IC dies 301-304 of the first type may be processing IC dies, such as microprocessors, graphics processing units (GPUs), or programmable logic ICs. IC dies 311-314 of the second type may be peripheral IC dies, such as transceiver IC dies or memory IC dies.

IC die 301 includes three interface circuits 341-343 and an input/output (I/O) circuit 344 that are adjacent to 4 sides of IC die 301. Configurable interface circuit 200 in FIG. 2 is an example of each of the interface circuits 341-343. IC die 302 includes three interface circuits 351-353 and an input/output (I/O) circuit 354 that are adjacent to 4 sides of IC die 302. Configurable interface circuit 200 in FIG. 2 is an example of each of the interface circuits 351-353. IC die 303 includes three interface circuits 361-363 and an input/output (I/O) circuit 364 that are adjacent to 4 sides of IC die 303. Configurable interface circuit 200 in FIG. 2 is an example of each of the interface circuits 361-363. IC die 304 includes three interface circuits 371-373 and an input/output (I/O) circuit 374 that are adjacent to 4 sides of IC die 304. Configurable interface circuit 200 of FIG. 2 is an example of each of the interface circuits 371-373. Thus, each of the interface circuits 341-343, 351-353, 361-363, and 371-373 may include a different instance of configurable interface circuit 200. Each of the interface circuits 341-343, 351-353, 361-363, and 371-373 can be configured during manufacture or assembly of package 300 to exchange signals with an IC die of the first type or of the second type through interface circuits 202 or 201, respectively, using selector circuits 203-204, as disclosed herein with respect to FIG. 2.

Interface circuits 341, 353, 363, and 371 exchange information with IC dies 311, 312, 313, and 314 through paths 321, 323, 324, and 326, respectively. In an implementation of FIG. 3, each of interface circuits 341, 353, 363, and 371 is configured during manufacture or assembly of package 300 to provide signals through interface circuit 201 using selector circuits 203 and 204, by setting SEL to the first value as disclosed herein with respect to FIG. 2, because interface circuits 341, 353, 363, and 371 are coupled to exchange signals with ICs 311-314, respectively, of the second type.

Interface circuits 343 and 351 exchange information through path 322. Interface circuits 342 and 362 exchange information through path 327. Interface circuits 361 and 373 exchange information through path 325. Interface circuits 352 and 372 exchange information through path 328. In an implementation of FIG. 3, each of the interface circuits 342, 343, 351, 352, 361, 362, 372, and 373 is configured during the manufacture or assembly of package 300 to provide signals through interface circuit 202 using selector circuits 203 and 204, by setting SEL to the second value as disclosed herein with respect to FIG. 2, because each of the interface circuits 342, 343, 351, 352, 361, 362, 372, and 373 is coupled to exchange signals with another one of these interface circuits in one of the ICs 301-304 of the first type.

IC dies 311-314 exchange information with external devices through paths 331-334, respectively. I/O circuits 344, 354, 364, and 374 exchange information with external devices through paths 335, 336, 337, and 338, respectively. Exchanging information may, for example, include transmitting and/or receiving various types of signals (e.g., data signals, control signals, clock signals etc.) to and from another device.

According to other examples, an IC package may include any number of the IC dies of the first type that each include one or more of the configurable interface circuits 200 of FIG. 2. An IC package may include IC dies of the first type that are arranged in rows and columns, as shown for example in FIG. 3, with respect to IC dies 301-304 being arranged in 2 rows and 2 columns. In other examples, an IC package may have two rows and three or more columns of the IC dies of the first type, such as IC dies 301-304. Each of the IC dies of the first type in the rows and columns has at least one configurable interface circuit 200. An IC package may, for example, have two rows and three columns of the IC dies of the first type, for a total of 6 of the IC dies of the first type. As another example, an IC package may have two rows and four columns of the IC dies of the first type, for a total of 8 of the IC dies of the first type.

Figure 4:
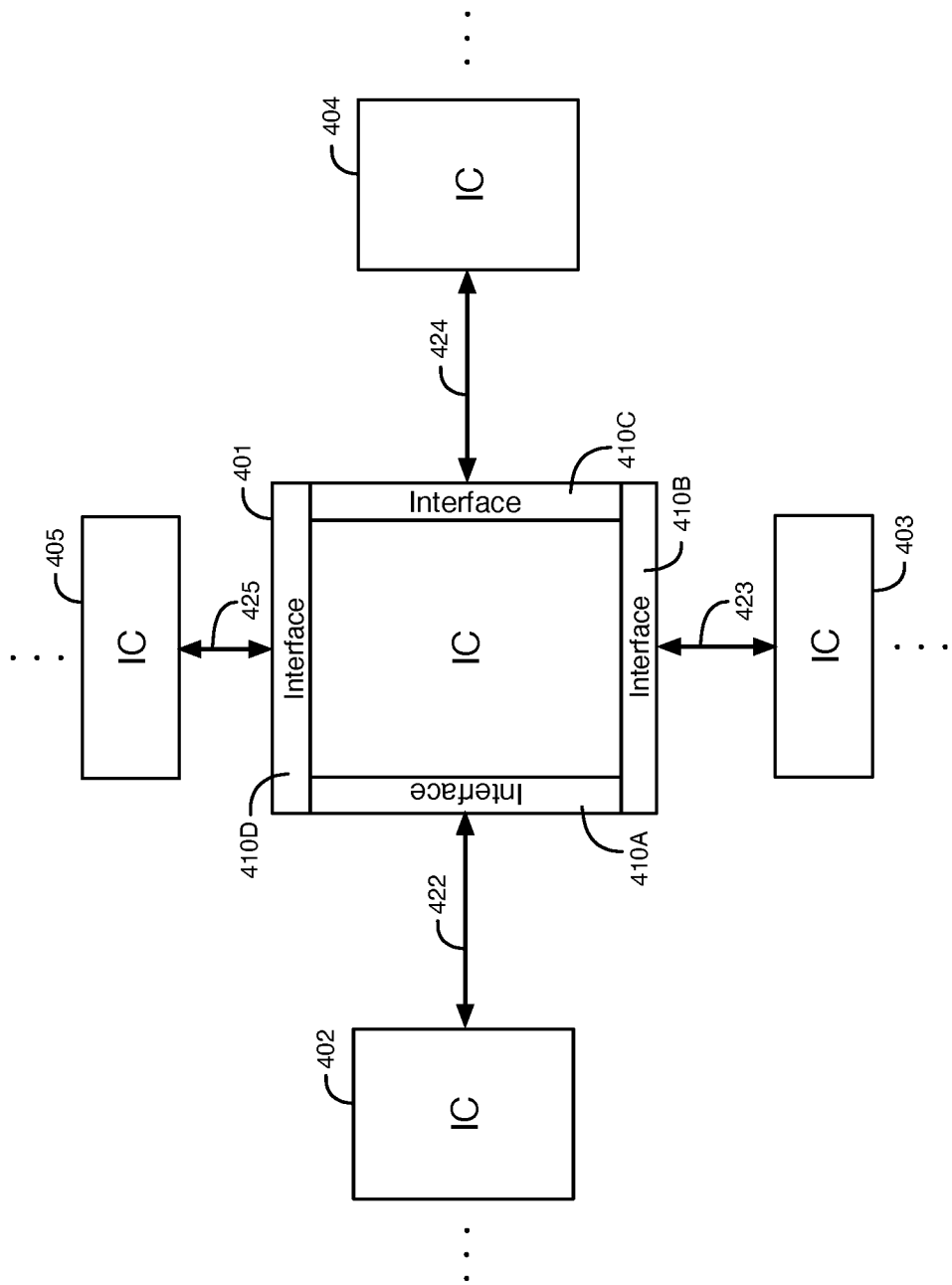
FIG. 4 is a diagram that illustrates an example of an electronic system with 5 IC dies including an IC die with 4 configurable interface circuits.

FIG. 4 is a diagram that illustrates an example of an electronic system that includes an integrated circuit (IC) die 401 having four configurable interface circuits. The electronic system of FIG. 4 may, for example, be formed in a package or on a circuit board. The electronic system of FIG. 4 includes 5 IC dies 401-405. IC die 401 may be, for example, a processing IC die of the first type, such as a microprocessor, a graphics processing unit (GPU), or a programmable logic IC. IC dies 402-405 may be IC dies of the first type or of the second type. One or more of the IC dies 402-405 may be peripheral IC dies of the second type, such as transceiver IC dies or memory IC dies. One or more of the IC dies 402-405 may be processing IC dies of the first type, such as microprocessors, graphics processing units (GPUs), or programmable logic ICs.

FIG. 4 illustrates an example of the IC die 401 that includes 4 configurable interface circuits 410A-410D. One of the configurable interface circuits 410 is next to each of the 4 sides of IC die 401. Configurable interface circuit 200 of FIG. 2 is an example of each of the interface circuits 410A-410D. Each of the interface circuits 410A-410D may include a different instance of configurable interface circuit 200. The electronic system shown in FIG. 4 may, for example, be part of a package that houses any number of IC dies. For example, the electronic system of FIG. 4 may be housed in a package that includes 4, 6, 8, 10, 12, 14, 16, 18, 20, etc. IC dies. Two, three, four, five, six, seven, eight, or more of the IC dies in the package may include one or more of the configurable interface circuits 200.

Interface circuits 410A, 410B, 410C, and 410D exchange information with IC dies 402, 403, 404, and 405 through paths 422, 423, 424, and 425, respectively. Each of the interface circuits 410A-410D can be configured during manufacture or assembly of the system to exchange signals containing information with an IC die of the first type or of the second type through interface circuit 202 or 201, respectively, using selector circuits 203-204, as disclosed herein with respect to FIG. 2. As an example, if IC die 402 is an IC of the first type, then interface circuit 410A is configured to transfer signals between IC die 402 and IC die 401 through interface circuit 202 in interface circuit 410A. If IC die 402 is an IC of the second type, then interface circuit 410A is configured to transfer signals between IC die 402 and IC die 401 through the interface circuit 201 in interface circuit 410A.

An IC package may include two or more rows of the IC dies of the first type and two or more columns of the IC dies of the first type, such as IC dies 301-304 and 401. Each of the IC dies of the first type has at least one configurable interface circuit 200. Each of the rows may contain two or more IC dies of the first type, and each of the columns may contain two or more IC dies of the first type. The rows and columns of IC dies may be arranged in a rectangular shape or in a square shape. For example, an IC package may have three rows and three columns of IC dies of the first type, for a total of 9 IC dies of the first type. As another example, an IC package may have three rows and four columns of IC dies of the first type, for a total of 12 IC dies of the first type. As yet another example, an IC package may have four rows and four columns of IC dies of the first type, for a total of 16 IC dies of the first type. Each of these configurations may have any number of the IC dies of the second type.

Figure 5:
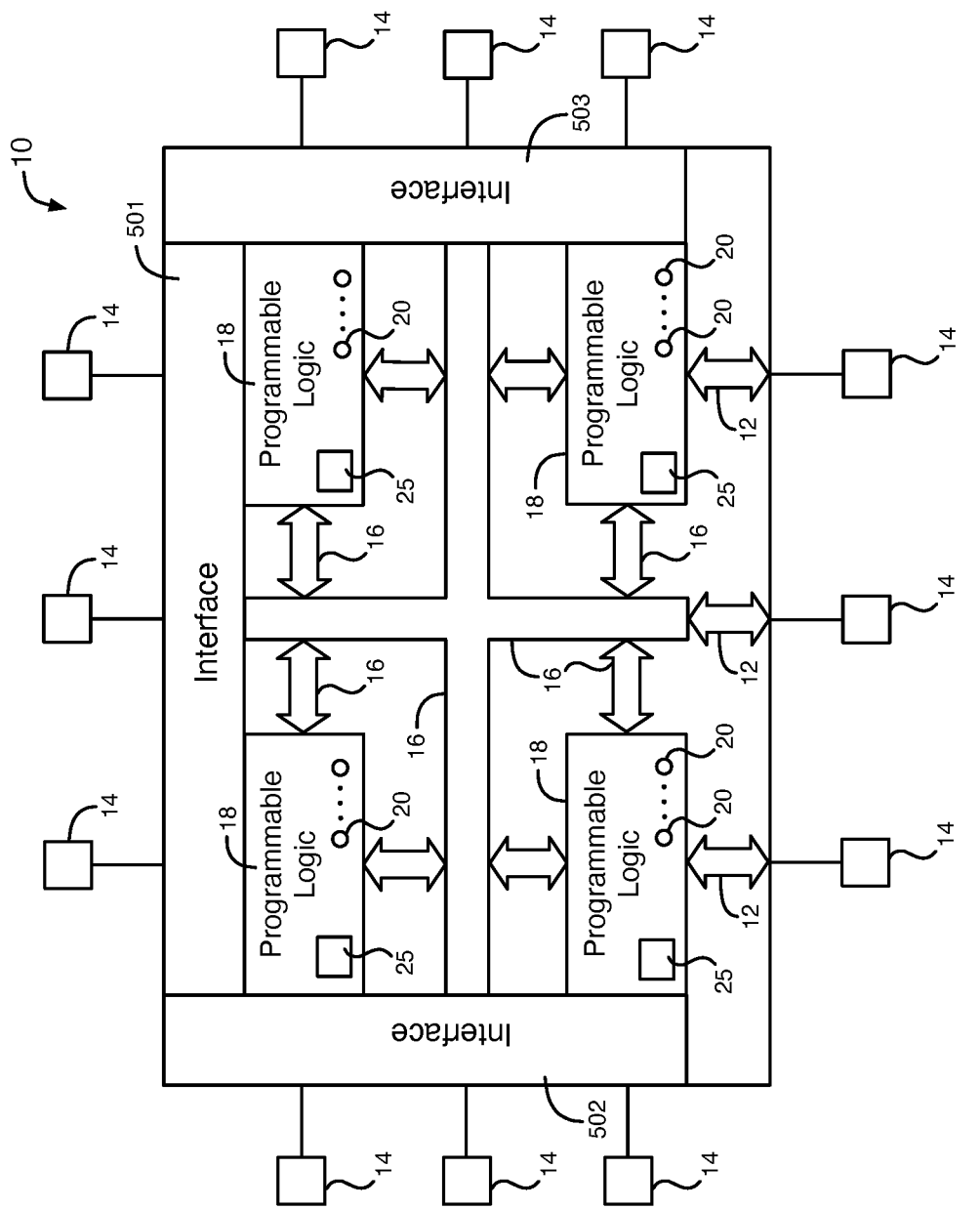
FIG. 5 is a diagram of an illustrative programmable logic integrated circuit (IC) that includes three configurable interface circuits.

An illustrative programmable logic integrated circuit (IC) 10 that includes three configurable interface circuits 501-503 is shown in FIG. 5. The configurable interface circuits 501, 502, and 503 are adjacent to three sides of the IC 10 as shown in FIG. 5. Configurable interface circuit 200 is an example of each of interface circuits 501-503. Each of the configurable interface circuits 501, 502, and 503 may include an instance of the configurable interface circuit 200 of FIG. 2.

As shown in FIG. 5, programmable logic integrated circuit 10 may have input-output circuitry 12 adjacent to one edge of IC 10 for driving signals off of IC 10 and for receiving signals from other devices via input-output pads 14. Input-output pads 14 are external terminals of IC 10. Interface circuits 501-503 are coupled to a subset of pads 14.

IC 10 may use interface circuits 501-503 and input-output circuitry 12 to exchange information with external devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects).

IC 10 also includes 4 regions 18 of programmable logic circuits. The programmable logic circuits in regions 18 may include combinational and sequential logic circuitry, such as logic circuits 25. The programmable logic circuits in regions 18 may be configured to perform custom logic functions according to a custom design for IC 10. Each of the configurable interface circuits 501-503 may be configured during manufacture or assembly of an electronic system including IC 10 to exchange information between the programmable logic circuits in regions 18 (such as logic circuits 25) and an external IC of the first type or of the second type through interface circuit 202 or 201, respectively.

Programmable logic IC 10 contains memory elements 20 that can be loaded with configuration data (also called programming data) using pads 14 and input-output circuitry 12. Once loaded, the memory elements 20 may each provide a corresponding static control output signal that controls the state of an associated logic component in the programmable logic circuits in one of regions 18. Typically, the memory element output signals are used to control the gates of metal-oxide-semiconductor (MOS) transistors. In the context of programmable logic integrated circuits, memory elements 20 store configuration data and are sometimes referred to as configuration random-access memory (CRAM) cells.

In general, software and data for performing any of the functions disclosed herein (e.g., by interface circuits 201-202) may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Example 1 is an integrated circuit comprising: a region of logic circuits; first and second selector circuits; a first interface circuit for exchanging information with a first type of device according to a first communication protocol; and a second interface circuit for exchanging information with a second type of device according to a second communication protocol, wherein the first selector circuit is configurable to provide signals between the region of the logic circuits and a selected one of the first or the second interface circuits, and wherein the second selector circuit is configurable to provide signals between the selected one of the first or the second interface circuits and the first or the second type of device.

In Example 2, the integrated circuit of Example 1 may optionally further comprise: third and fourth selector circuits; a third interface circuit for exchanging information with the first type of device according to the first communication protocol; and a fourth interface circuit for exchanging information with the second type of device according to the second communication protocol, wherein the third selector circuit is configurable to provide signals between the region of the logic circuits and a selected one of the third or the fourth interface circuits, and wherein the fourth selector circuit is configurable to provide signals between the selected one of the third or the fourth interface circuits and the first or the second type of device.

In Example 3, the integrated circuit of Example 2 may optionally further comprise: fifth and sixth selector circuits; a fifth interface circuit for exchanging information with the first type of device according to the first communication protocol; and a sixth interface circuit for exchanging information with the second type of device according to the second communication protocol, wherein the fifth selector circuit is configurable to provide signals between the region of the logic circuits and a selected one of the fifth or the sixth interface circuits, and wherein the sixth selector circuit is configurable to provide signals between the selected one of the fifth or the sixth interface circuits and the first or the second type of device.

In Example 4, the integrated circuit of any one of Examples 1-3 may optionally further comprise: input-output circuits configurable to exchange signals between the region of the logic circuits and an external electronic system.

In Example 5, the integrated circuit of any one of Examples 1~4 may optionally include, wherein the first selector circuit is coupled to at least one of the logic circuits and to the first and the second interface circuits, and wherein the second selector circuit is coupled to the first and the second interface circuits and to an external terminal of the integrated circuit.

In Example 6, the integrated circuit of any one of Examples 1-5 may optionally include, wherein the first type of device is a processing integrated circuit, and wherein the second type of device is one of a transceiver integrated circuit or a memory integrated circuit.

In Example 7, the integrated circuit of any one of Examples 1-6 may optionally include, wherein the first selector circuit is configurable to provide bidirectional communications between at least one of the logic circuits and the selected one of the first or the second interface circuits, and wherein the second selector circuit is configurable to provide bidirectional communications between the selected one of the first or the second interface circuits and an additional integrated circuit.

In Example 8, the integrated circuit of any one of Examples 1-7 may optionally include, wherein the integrated circuit is a programmable logic integrated circuit, and wherein the region of the logic circuits comprises programmable logic circuits.

Example 9 is an integrated circuit package comprising: a first integrated circuit comprising first and second selector circuits, a first interface circuit for exchanging information according to a first communication protocol, and a second interface circuit for exchanging information according to a second communication protocol; and a second integrated circuit coupled to the first integrated circuit, wherein the first and the second selector circuits are configurable to select one of the first interface circuit or the second interface circuit to exchange information with the second integrated circuit through first conductors in the integrated circuit package.

In Example 10, the integrated circuit package of Example 9 may optionally further comprise: a third integrated circuit coupled to the first integrated circuit, wherein the first integrated circuit further comprises a third interface circuit for exchanging information according to the first communication protocol, a fourth interface circuit for exchanging information according to the second communication protocol, and third and fourth selector circuits that are configurable to select one of the third interface circuit or the fourth interface circuit to exchange information with the third integrated circuit through second conductors in the integrated circuit package.

In Example 11, the integrated circuit package of Example 10 may optionally further comprise: a fourth integrated circuit coupled to the first integrated circuit, wherein the first integrated circuit further comprises a fifth interface circuit for exchanging information according to the first communication protocol, a sixth interface circuit for exchanging information according to the second communication protocol, and fifth and sixth selector circuits that are configurable to select one of the fifth interface circuit or the sixth interface circuit to exchange information with the fourth integrated circuit through third conductors in the integrated circuit package.

In Example 12, the integrated circuit package of any one of Examples 9-11 may optionally include, wherein the first integrated circuit is a processing integrated circuit, and wherein the second integrated circuit is one of a transceiver integrated circuit or a memory integrated circuit.

In Example 13, the integrated circuit package of any one of Examples 9-11 may optionally include, wherein the first and the second integrated circuits are programmable logic integrated circuits.

In Example 14, the integrated circuit package of any one of Examples 9-13 may optionally include, wherein the first integrated circuit is a programmable logic integrated circuit comprising programmable logic circuits, and wherein the first selector circuit is coupled to exchange the information between the programmable logic circuits and the selected one of the first interface circuit or the second interface circuit.

In Example 15, the integrated circuit package of any one of Examples 9-14 may optionally include, wherein the first selector circuit is coupled to at least one logic circuit in the first integrated circuit and to the first and the second interface circuits, and wherein the second selector circuit is coupled to the first and the second interface circuits and to the second integrated circuit.

In Example 16, the integrated circuit package of Example 9 may optionally include, wherein the second integrated circuit comprises a third interface circuit for exchanging information according to the first communication protocol, a fourth interface circuit for exchanging information according to the second communication protocol, and third and fourth selector circuits that are configurable to select one of the third interface circuit or the fourth interface circuit to exchange information with the selected one of the first interface circuit or the second interface circuit through the first conductors in the integrated circuit package.

Example 17 is a method for interfacing between devices in an electronic system, the method comprising: providing a first interface circuit in an integrated circuit for exchanging information with a first type of device according to a first data transmission protocol; providing a second interface circuit in the integrated circuit for exchanging information with a second type of device according to a second data transmission protocol; configuring a first selector circuit in the integrated circuit to provide information between a region of logic circuits in the integrated circuit and a selected one of the first or the second interface circuits; and configuring a second selector circuit in the integrated circuit to provide information between the selected one of the first or the second interface circuits and the first or the second type of device.

In Example 18, the method of Example 17 may optionally further comprise: providing a third interface circuit in the integrated circuit for exchanging information with the first type of device according to the first data transmission protocol; providing a fourth interface circuit in the integrated circuit for exchanging information with the second type of device according to the second data transmission protocol; configuring a third selector circuit in the integrated circuit to provide information between the region of the logic circuits and a selected one of the third or the fourth interface circuits; and configuring a fourth selector circuit in the integrated circuit to provide information between the selected one of the third or the fourth interface circuits and the first or the second type of device.

In Example 19, the method of any one of Examples 17-18 may optionally include, wherein the first type of device is a processing integrated circuit, and wherein the second type of device is one of a transceiver integrated circuit or a memory integrated circuit.

In Example 20, the method of any one of Examples 17-19 may optionally include, wherein the integrated circuit is a processing integrated circuit.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. An integrated circuit comprising:
   a region of logic circuits;
   first and second selector circuits;
   a first interface circuit for exchanging information with a first device according to a first communication protocol; and
   a second interface circuit for exchanging information with a second device according to a second communication protocol, wherein the first selector circuit is configurable to provide signals between the region of the logic circuits and a selected one of the first or the second interface circuits, wherein the second selector circuit is configurable to provide signals between the selected one of the first or the second interface circuits and the first or the second device,
   wherein the first selector circuit is coupled to at least one of the logic circuits and to the first and the second interface circuits, and wherein the second selector circuit is coupled to the first and the second interface circuits and to an external terminal of the integrated circuit.

2. The integrated circuit of claim 1 further comprising:
   third and fourth selector circuits;
   a third interface circuit for exchanging information with the first device according to the first communication protocol; and
   a fourth interface circuit for exchanging information with the second device according to the second communication protocol, wherein the third selector circuit is configurable to provide signals between the region of the logic circuits and a selected one of the third or the fourth interface circuits, and wherein the fourth selector circuit is configurable to provide signals between the selected one of the third or the fourth interface circuits and the first or the second device.

3. The integrated circuit of claim 2 further comprising:
fifth and sixth selector circuits;
a fifth interface circuit for exchanging information with the first device according to the first communication protocol; and
a sixth interface circuit for exchanging information with the second device according to the second communication protocol, wherein the fifth selector circuit is configurable to provide signals between the region of the logic circuits and a selected one of the fifth or the sixth interface circuits, and wherein the sixth selector circuit is configurable to provide signals between the selected one of the fifth or the sixth interface circuits and the first or the second device.

4. The integrated circuit of claim 1 further comprising:
input-output circuits configurable to exchange signals between the region of the logic circuits and an external electronic system.

5. The integrated circuit of claim 1, wherein each of the first selector circuit and the second selector circuit is configurable to function as a multiplexer circuit or as a demultiplexer circuit.

6. The integrated circuit of claim 1, wherein the first device is a processing integrated circuit, and wherein the second device is one of a transceiver integrated circuit or a memory integrated circuit.

7. The integrated circuit of claim 1, wherein the first selector circuit is configurable to provide bidirectional communications between at least one of the logic circuits and the selected one of the first or the second interface circuits, and wherein the second selector circuit is configurable to provide bidirectional communications between the selected one of the first or the second interface circuits and an additional integrated circuit.

8. The integrated circuit of claim 1, wherein the integrated circuit is a programmable logic integrated circuit, and wherein the region of the logic circuits comprises programmable logic circuits.

9. An integrated circuit package comprising:
a first integrated circuit comprising first and second selector circuits, a first interface circuit for exchanging information according to a first communication protocol, and a second interface circuit for exchanging information according to a second communication protocol; and
a second integrated circuit coupled to the first integrated circuit, wherein the first and the second selector circuits are configurable to select one of the first interface circuit or the second interface circuit to exchange information with the second integrated circuit through first conductors in the integrated circuit package.

10. The integrated circuit package of claim 9 further comprising:
a third integrated circuit coupled to the first integrated circuit, wherein the first integrated circuit further comprises a third interface circuit for exchanging information according to the first communication protocol, a fourth interface circuit for exchanging information according to the second communication protocol, and third and fourth selector circuits that are configurable to select one of the third interface circuit or the fourth interface circuit to exchange information with the third integrated circuit through second conductors in the integrated circuit package.

11. The integrated circuit package of claim 10 further comprising:
a fourth integrated circuit coupled to the first integrated circuit, wherein the first integrated circuit further comprises a fifth interface circuit for exchanging information according to the first communication protocol, a sixth interface circuit for exchanging information according to the second communication protocol, and fifth and sixth selector circuits that are configurable to select one of the fifth interface circuit or the sixth interface circuit to exchange information with the fourth integrated circuit through third conductors in the integrated circuit package.

12. The integrated circuit package of claim 9, wherein the first integrated circuit is a processing integrated circuit, and wherein the second integrated circuit is one of a transceiver integrated circuit or a memory integrated circuit.

13. The integrated circuit package of claim 9, wherein the first and the second integrated circuits are programmable logic integrated circuits.

14. The integrated circuit package of claim 9, wherein the first integrated circuit is a programmable logic integrated circuit comprising programmable logic circuits, and wherein the first selector circuit is coupled to exchange the information between the programmable logic circuits and the selected one of the first interface circuit or the second interface circuit.

15. The integrated circuit package of claim 9, wherein the first selector circuit is coupled to at least one logic circuit in the first integrated circuit and to the first and the second interface circuits, and wherein the second selector circuit is coupled to the first and the second interface circuits and to the second integrated circuit.

16. The integrated circuit package of claim 9, wherein the second integrated circuit comprises a third interface circuit for exchanging information according to the first communication protocol, a fourth interface circuit for exchanging information according to the second communication protocol, and third and fourth selector circuits that are configurable to select one of the third interface circuit or the fourth interface circuit to exchange information with the selected one of the first interface circuit or the second interface circuit through the first conductors in the integrated circuit package.

17. A method for interfacing between first and second devices in an electronic system, the method comprising:
providing a first interface circuit in an integrated circuit for exchanging information with the first device according to a first data transmission protocol;
providing a second interface circuit in the integrated circuit for exchanging information with the second device according to a second data transmission protocol;
configuring a first selector circuit in the integrated circuit to provide bidirectional communications between a region of logic circuits in the integrated circuit and a selected one of the first or the second interface circuits; and
configuring a second selector circuit in the integrated circuit to provide bidirectional communications between the selected one of the first or the second interface circuits and the first or the second device.

18. The method of claim 17 further comprising:
providing a third interface circuit in the integrated circuit for exchanging information with the first device according to the first data transmission protocol;
providing a fourth interface circuit in the integrated circuit for exchanging information with the second device according to the second data transmission protocol;
configuring a third selector circuit in the integrated circuit to provide information between the region of the logic circuits and a selected one of the third or the fourth interface circuits; and
configuring a fourth selector circuit in the integrated circuit to provide information between the selected one of the third or the fourth interface circuits and the first or the second device.

19. The method of claim 17, wherein the first device is a processing integrated circuit, and wherein the second device is one of a transceiver integrated circuit or a memory integrated circuit.

20. The method of claim 17, wherein the integrated circuit is a processing integrated circuit.

* * * * *